(12) United States Patent
Takahashi et al.

(10) Patent No.: US 12,438,342 B2
(45) Date of Patent: Oct. 7, 2025

(54) SEMICONDUCTOR LIGHT-EMITTING ELEMENT AND METHOD OF FABRICATING SEMICONDUCTOR LIGHT-EMITTING ELEMENT

(71) Applicant: Nuvoton Technology Corporation Japan, Kyoto (JP)

(72) Inventors: Kunimasa Takahashi, Toyama (JP); Shinji Yoshida, Shiga (JP); Hidetoshi Furukawa, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 783 days.

(21) Appl. No.: 17/723,963

(22) Filed: Apr. 19, 2022

(65) Prior Publication Data

US 2022/0247156 A1    Aug. 4, 2022

Related U.S. Application Data

(63) Continuation of application No. PCT/JP2020/041250, filed on Nov. 4, 2020.

(30) Foreign Application Priority Data

Nov. 8, 2019    (JP) ................................. 2019-203485

(51) Int. Cl.
*H01S 5/30*      (2006.01)
*H01S 5/22*      (2006.01)
(Continued)

(52) U.S. Cl.
CPC .............. *H01S 5/305* (2013.01); *H01S 5/221* (2013.01); *H01S 5/3063* (2013.01);
(Continued)

(58) Field of Classification Search
CPC .... H01S 5/305; H01S 5/3063; H01S 5/34333; H01S 5/2009; H01S 5/3086; H01L 21/0254
See application file for complete search history.

(56) References Cited

U.S. PATENT DOCUMENTS

| | | | |
|---|---|---|---|
| 2010/0055820 A1 | 3/2010 | Akita et al. | |
| 2012/0228581 A1* | 9/2012 | Hwang | B82Y 20/00 257/E33.034 |
| 2022/0294188 A1* | 9/2022 | Morohashi | H01S 5/3077 |

FOREIGN PATENT DOCUMENTS

| | | |
|---|---|---|
| JP | 2009-152448 A | 7/2009 |
| JP | 2010-056158 A | 3/2010 |

(Continued)

OTHER PUBLICATIONS

J. Li et al, "Optical and electrical properties of Mg-doped p-type AlxGa1-xN" Appl. Phys. Lett. 80, 1210-1212 (2002) (Year: 2002).*

(Continued)

*Primary Examiner* — Tod T Van Roy
*Assistant Examiner* — Delma R Forde
(74) *Attorney, Agent, or Firm* — Rimon P.C.

(57) ABSTRACT

A semiconductor light-emitting element includes a light emission layer including a group III nitride semiconductor; an electron barrier layer disposed above the light emission layer and including a group III nitride semiconductor containing Al; and a p-type clad layer disposed above and in contact with the electron barrier layer, wherein the electron barrier layer and the p-type clad layer contain Mg as a dopant, and the p-type clad layer includes a high carbon concentration region containing carbon and a low carbon concentration region having a carbon concentration lower than a carbon concentration of the high carbon concentration region, in a stated order from an electron barrier layer side.

26 Claims, 6 Drawing Sheets

(51) Int. Cl.
  *H01S 5/343* (2006.01)
  *H01L 21/02* (2006.01)
(52) U.S. Cl.
  CPC ...... *H01S 5/34333* (2013.01); *H01S 5/34346* (2013.01); *H01L 21/0254* (2013.01); *H01L 21/02579* (2013.01); *H01L 21/0262* (2013.01)

(56) References Cited

FOREIGN PATENT DOCUMENTS

| | | | | |
|---|---|---|---|---|
| JP | 2021027324 A | * | 2/2021 | ............ H01L 33/32 |
| WO | 2007/013257 A1 | | 2/2007 | |

OTHER PUBLICATIONS

International Search Report issued on Jan. 12, 2021 in International Patent Application No. PCT/JP2020/041250, with English translation.

* cited by examiner

FIG. 2

| Layer | Material | In composition ratio or Al composition ratio [%] | Thickness [nm] | Impurity and concentration [cm$^{-3}$] |
|---|---|---|---|---|
| Pad electrode | Au | - | 2000 | - |
| Adhesion layer | Pt | - | 50 | - |
| | Ti | - | 10 | - |
| P-side electrode | Pt | - | 35 | - |
| | Pd | - | 40 | - |
| Current block layer | SiO$_2$ | - | 300 | - |
| Contact layer | GaN | 0 | 10 | Mg: 2 × 10$^{20}$ |
| | GaN | 0 | 50 | Mg: 2 × 10$^{19}$ |
| P-type clad layer | AlGaN | 3.5 | 660 | Mg: 1 × 10$^{19}$<br>Mg: 2 × 10$^{18}$ |
| Electron barrier layer | AlGaN | 36 | 2 | Mg: 2 × 10$^{19}$ |
| | | 2 → 36 | 5 | Mg: 2 × 10$^{19}$ |
| Intermediate layer | GaN | 0 | 3 | Mg: 2 × 10$^{19}$ |
| | InGaN | 3 → 0 | 21 | - |
| P-side guide layer | InGaN | 3 | 98 | - |
| Light emission layer | InGaN | 4 | 5 | - |
| | InGaN | 18 | 2.8 | - |
| | InGaN | 4 | 7 | - |
| | InGaN | 18 | 2.8 | - |
| | InGaN | 4 | 7 | - |
| N-side guide layer | InGaN | 3 | 175 | - |
| | GaN | 0 | 100 | Si: 1 × 10$^{18}$ |
| N-type clad layer | AlGaN | 3.5 | 1500 | Si: 1 × 10$^{18}$ |
| Substrate | GaN | - | 85000 | Si: 1 × 10$^{18}$ |
| N-side electrode | Ti | - | 10 | - |
| | Pt | - | 35 | - |
| | Au | - | 300 | - |

# SEMICONDUCTOR LIGHT-EMITTING ELEMENT AND METHOD OF FABRICATING SEMICONDUCTOR LIGHT-EMITTING ELEMENT

CROSS REFERENCE TO RELATED APPLICATIONS

This is a continuation application of PCT International Application No. PCT/JP2020/041250 filed on Nov. 4, 2020, designating the United States of America, which is based on and claims priority of Japanese Patent Application No. 2019-203485 filed on Nov. 8, 2019. The entire disclosures of the above-identified applications, including the specifications, drawings and claims are incorporated herein by reference in their entirety.

FIELD

The present disclosure relates to a semiconductor light-emitting element and a method of fabricating a semiconductor light-emitting element.

BACKGROUND

In recent years, semiconductor light-emitting elements such as semiconductor laser elements have been attracting attention as light sources for various applications, including light sources for image display devices such as displays and projectors, light sources for lighting, and light sources for laser processing. Higher output power is desired for semiconductor laser elements used as light sources for the above applications.

Due to self-heating of the semiconductor laser elements during high power operation of the semiconductor laser elements, electrons injected into an active layer may be thermally excited and leak out from the active layer to a p-type clad layer. In order to suppress reactive current caused by such leakage of electrons from the active layer, there is a known technique of providing an electron barrier layer between the active layer and the p-type clad layer (see, for example, Patent Literature (PTL) 1).

In the semiconductor laser element disclosed in PTL 1, an electron barrier layer having a band gap energy higher than that of the p-type clad layer is provided between the active layer and the p-type clad layer to suppress the leakage of electrons from the active layer to the p-type clad layer.

CITATION LIST

Patent Literature

PTL 1: WO 2007/013257

SUMMARY

Technical Problem

In the semiconductor laser element disclosed in PTL 1, the conductivity of the electron barrier layer is increased by doping the electron barrier layer with an impurity such as Mg, in order to suppress a rise in the operating voltage caused by the provision of the electron barrier layer. On the other hand, since the impurity such as Mg causes light absorption loss, the p-type clad layer is doped with an impurity at a concentration lower than that of the electron barrier layer.

However, the inventors have found that the impurity concentration increases in the p-type clad layer, especially in the region on the electron barrier layer side. This phenomenon is thought to be caused by the fact that, when the electron barrier layer and the p-type clad layer of the semiconductor laser element are formed in the chamber for crystal growth, a part of Mg used in the formation of the electron barrier layer remains on, for example, the chamber inner wall, and this residual Mg is taken into the p-type clad layer. Such an increase in the impurity concentration in the region on the electron barrier layer side of the p-type clad layer causes an increase in light absorption loss.

To solve such problems, the present disclosure has an object to suppress light absorption loss in a p-type clad layer of a semiconductor light-emitting element that includes an electron barrier layer.

Solution to Problem

In order to solve the above problems, a semiconductor light-emitting element according to an aspect of the present disclosure is a semiconductor light-emitting element including: a light emission layer including a group III nitride semiconductor; an electron barrier layer disposed above the light emission layer and including a group III nitride semiconductor containing Al; and a clad layer disposed above and in contact with the electron barrier layer, wherein the electron barrier layer and the clad layer contain Mg as a dopant, and the clad layer includes a high carbon concentration region containing carbon and a low carbon concentration region having a carbon concentration lower than a carbon concentration of the high carbon concentration region, in a stated order from an electron barrier layer side.

By providing the high carbon concentration region, which has a high carbon concentration, closer to the electron barrier layer (that is, closer to the light emission layer) than the low carbon concentration region, it is possible to form a high carbon concentration region in which the Mg uptake amount is suppressed. Therefore, it is possible to suppress the Mg concentration in the clad layer of the semiconductor light-emitting element. As described above, since the region in which the Mg concentration is suppressed is disposed closer to the electron barrier layer (that is, closer to the light emission layer) than the low carbon concentration region, it is possible to suppress the Mg concentration in the region having a higher light intensity. This makes it possible to suppress an increase in light absorption loss in the clad layer caused by the provision of the electron barrier layer. Further, since the clad layer includes the low carbon concentration region having a carbon concentration lower than the carbon concentration of the high carbon concentration region, it is possible to suppress deterioration of the crystal quality of the clad layer as compared to the case where the entire clad layer is the high carbon concentration region.

In the semiconductor light-emitting element according to an aspect of the present disclosure, the high carbon concentration region may include a decrease region in which an Mg concentration decreases with an increase in distance from the electron barrier layer.

As described above, by decreasing the Mg concentration in the clad layer, it is possible to suppress an increase in light absorption loss in the clad layer caused by the provision of the electron barrier layer.

In the semiconductor light-emitting element according to an aspect of the present disclosure, the decrease region may include a region which is separated from an interface between the clad layer and the electron barrier layer by 50 nm or more and in which a rate of change in Mg concentration with respect to a position in a layering direction is $0.5 \times 10^{17}$ cm$^{-3}$/nm or more.

As described above, since the clad layer includes a region in which the Mg concentration sharply decreases, it is possible to suppress an increase in light absorption loss in the clad layer caused by the provision of the electron barrier layer.

In the semiconductor light-emitting element according to an aspect of the present disclosure, the clad layer may include a low concentration ratio region in which a concentration ratio of carbon to Mg is low and a high concentration ratio region which is disposed above the low concentration ratio region and in which the concentration ratio of carbon to Mg is higher than the concentration ratio of carbon to Mg in the low concentration ratio region.

As described above, since the clad layer includes the low concentration ratio region having a low Mg concentration, at a position closer to the electron barrier layer than the high concentration ratio region, it is possible to suppress an increase in light absorption loss in the clad layer caused by the provision of the electron barrier layer.

In the semiconductor light-emitting element according to an aspect of the present disclosure, the clad layer may include a region in which a concentration ratio of carbon to Mg is 1% or less.

As described above, since the clad layer includes a region having a low Mg concentration, it is possible to suppress an increase in light absorption loss in the clad layer caused by the provision of the electron barrier layer.

In the semiconductor light-emitting element according to an aspect of the present disclosure, the clad layer may include a low Mg concentration region containing Mg and a high Mg concentration region disposed above the low Mg concentration region and having an Mg concentration higher than an Mg concentration of the low Mg concentration region.

As described above, since the clad layer includes the low Mg concentration region at a position closer to the electron barrier layer than the high Mg concentration region, it is possible to suppress an increase in light absorption loss in the clad layer caused by the provision of the electron barrier layer. Further, since the clad layer includes the high Mg concentration region, the resistance of the clad layer can be reduced.

In the semiconductor light-emitting element according to an aspect of the present disclosure, the electron barrier layer may have an Mg concentration of $1 \times 10^7$ cm$^{-3}$ or more and $1 \times 10^{20}$ cm$^{-3}$ or less.

As described above, by doping the electron barrier layer with Mg, the resistance of the electron barrier layer can be reduced.

In the semiconductor light-emitting element according to an aspect of the present disclosure, the clad layer may be disposed above a main surface of a group III nitride semiconductor substrate.

In the semiconductor light-emitting element according to an aspect of the present disclosure, the electron barrier layer may include a region in which a concentration ratio of carbon to Mg is $1 \times 10^{-3}$ or less.

As described above, by forming a region having a high Mg concentration in the electron barrier layer, the resistance of the electron barrier layer can be reduced.

In order to solve the above problems, a method of fabricating a semiconductor light-emitting element according to an aspect of the present disclosure includes: forming a light emission layer including a group III nitride semiconductor; forming an electron barrier layer above the light emission layer, the electron barrier layer including a group III nitride semiconductor containing Al; and forming a clad layer above and in contact with the electron barrier layer, wherein the forming of the electron barrier layer includes supplying Mg as a dopant, and the forming of the clad layer includes changing a growth rate.

As described above, by changing the growth rate in the forming of the clad layer, the clad layer includes a region that is formed at a high growth rate. In the region formed at a high growth rate, it is possible to suppress the uptake, into the clad layer, of Mg used at the time of forming the electron barrier layer. Therefore, the clad layer can include a region in which the Mg concentration is suppressed. This makes it possible to suppress an increase in light absorption loss in the clad layer caused by the provision of the electron barrier layer.

In the method of fabricating a semiconductor light-emitting element according to an aspect of the present disclosure, in the forming of the clad layer, the growth rate may be changed by changing a Ga supply amount.

As described above, by changing the Ga supply amount, the amount of Mg uptake into the clad layer can be changed. Since the Mg concentration can be suppressed in the region in which the Ga supply amount is high, it is possible to suppress an increase in light absorption loss in the clad layer caused by the provision of the electron barrier layer.

In the method of fabricating a semiconductor light-emitting element according to an aspect of the present disclosure, a Ga supply amount in the forming of the clad layer may be greater immediately after a start of the forming of the clad layer than immediately before an end of the forming of the clad layer.

As a result, the Mg concentration in, of the clad layer, the region adjacent to the electron barrier layer can be suppressed. Therefore, since the Mg concentration can be suppressed in, of the clad layer, the region in which the light intensity is the highest, it is possible to further suppress an increase in light absorption loss in the clad layer caused by the provision of the electron barrier layer.

In the method of fabricating a semiconductor light-emitting element according to an aspect of the present disclosure, the electron barrier layer and the clad layer may contain Mg as a dopant, and the clad layer may include a high carbon concentration region containing carbon and a low carbon concentration region having a carbon concentration lower than a carbon concentration of the high carbon concentration region, in a stated order from an electron barrier layer side.

The high carbon concentration region having a high carbon concentration is formed when, for example, the growth rate is high. The Mg uptake amount is suppressed in the high carbon concentration region formed at a high growth rate. Therefore, it is possible to suppress the Mg concentration in the clad layer of the semiconductor light-emitting element. As described above, since the region in which the Mg concentration is suppressed is disposed closer to the electron barrier layer (that is, closer to the light emission layer) than the low carbon concentration region, it is possible to suppress the Mg concentration in the region having a higher light intensity. This makes it possible to suppress an increase in light absorption loss in the clad layer caused by the provision of the electron barrier layer.

In the method of fabricating a semiconductor light-emitting element according to an aspect of the present disclosure, the high carbon concentration region may include a decrease region in which an Mg concentration decreases with an increase in distance from the electron barrier layer.

As described above, by decreasing the Mg concentration in the clad layer, it is possible to suppress an increase in light absorption loss in the clad layer caused by the provision of the electron barrier layer.

In the method of fabricating a semiconductor light-emitting element according to an aspect of the present disclosure, the decrease region may include a region which is separated from an interface between the clad layer and the electron barrier layer by 50 nm or more and in which a rate of change in Mg concentration with respect to a position in a layering direction is $0.5 \times 10^{17}$ cm$^{-3}$/nm or more.

As described above, since the clad layer includes a region in which the Mg concentration sharply decreases, it is possible to suppress an increase in light absorption loss in the clad layer caused by the provision of the electron barrier layer.

In the method of fabricating a semiconductor light-emitting element according to an aspect of the present disclosure, the clad layer may include a low concentration ratio region in which a concentration ratio of carbon to Mg is low and a high concentration ratio region which is disposed above the low concentration ratio region and in which the concentration ratio of carbon to Mg is higher than the concentration ratio of carbon to Mg in the low concentration ratio region.

As described above, since the clad layer includes the low concentration ratio region having a low Mg concentration, at a position closer to the electron barrier layer than the high concentration ratio region, it is possible to suppress an increase in light absorption loss in the clad layer caused by the provision of the electron barrier layer.

In the method of fabricating a semiconductor light-emitting element according to an aspect of the present disclosure, the clad layer may include a region in which a concentration ratio of carbon to Mg is 1% or less.

As described above, since the clad layer includes the low Mg concentration region at a position closer to the electron barrier layer than the high Mg concentration region, it is possible to suppress an increase in light absorption loss in the clad layer caused by the provision of the electron barrier layer. Further, since the clad layer includes the high Mg concentration region, the resistance of the clad layer can be reduced.

In the method of fabricating a semiconductor light-emitting element according to an aspect of the present disclosure, the clad layer may include a low Mg concentration region containing Mg and a high Mg concentration region disposed above the low Mg concentration region and having an Mg concentration higher than an Mg concentration of the low Mg concentration region.

As described above, since the clad layer includes the low Mg concentration region at a position closer to the electron barrier layer than the high Mg concentration region, it is possible to suppress an increase in light absorption loss in the clad layer caused by the provision of the electron barrier layer. Further, since the clad layer includes the high Mg concentration region, the resistance of the clad layer can be reduced.

In the method of fabricating a semiconductor light-emitting element according to an aspect of the present disclosure, the electron barrier layer may have an Mg concentration of $1 \times 10^{17}$ cm$^{-3}$ or more and $1 \times 10^{20}$ cm$^{-3}$ or less.

As described above, by doping the electron barrier layer with Mg, the resistance of the electron barrier layer can be reduced.

In the method of fabricating a semiconductor light-emitting element according to an aspect of the present disclosure, the electron barrier layer may include a region in which a concentration ratio of carbon to Mg is $1 \times 10^{-3}$ or less.

As described above, by forming a region having a high Mg concentration in the electron barrier layer, the resistance of the electron barrier layer can be reduced.

Advantageous Effects

According to the present disclosure, it is possible to suppress light absorption loss in a p-type clad layer of a semiconductor light-emitting element that includes an electron barrier layer.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 2 is a table showing respective configurations of layers included in the semiconductor light-emitting element according to the embodiment.

DESCRIPTION OF EMBODIMENT

Figure 1:
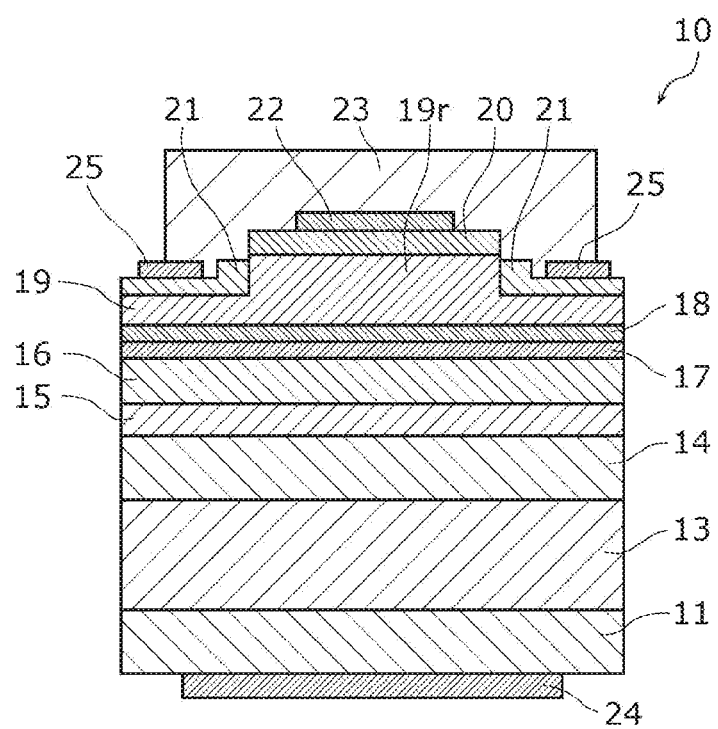
FIG. 1 is a cross-sectional view schematically illustrating an overall configuration of a semiconductor light-emitting element according to an embodiment.

Hereinafter, an exemplary embodiment of the present disclosure will be described with reference to the accompanying drawings. Note that the embodiment described below illustrates a specific example of the present disclosure. Therefore, the numerical values, shapes, materials, constituent elements, the arrangement and connection of the constituent elements, etc. illustrated in the embodiment below are mere examples, and do not intend to limit the present disclosure.

Furthermore, the drawings are represented schematically, and are not necessarily precise illustrations. Thus, the scales, for example, of the drawings are not necessarily precise. Note that, in the drawings, essentially the same constituent elements are given the same reference signs, and overlapping descriptions thereof will be omitted or simplified.

Furthermore, in the Specification, the terms "upper", "above", "lower", and "below" do not refer to the upward direction (vertically above) or the downward direction (vertically below) in the sense of absolute space recognition, but are defined by the relative positional relationship based on the layering order of a layered structure. In addition, the terms "upper", "above", "lower", and "below" are applied not only when two constituent elements are disposed apart from each other and there is another constituent element between the two constituent elements, but also when two constituent elements are disposed in contact with each other.

Embodiment

The following describes a semiconductor light-emitting element according to an embodiment.

[1. Overall Configuration]

First, an overall configuration of the semiconductor light-emitting element according to the present embodiment will be described with reference to FIG. 1 and FIG. 2. FIG. 1 is a cross-sectional view schematically illustrating an overall configuration of semiconductor light-emitting element 10 according to the present embodiment. FIG. 2 is a table showing respective configurations of layers included in semiconductor light-emitting element 10 according to the present embodiment. FIG. 2 shows the material, In composition ratio or Al composition ratio, thickness, and impurity (that is, a dopant) and its concentration, of each layer of semiconductor light-emitting element 10.

Semiconductor light-emitting element 10 illustrated in FIG. 1 and FIG. 2 is a semiconductor element that emits light when current is supplied. In the example illustrated in FIG. 1 and FIG. 2, semiconductor light-emitting element 10 is a semiconductor laser element that emits laser light. FIG. 1 illustrates a cross section perpendicular to the laser resonance direction of semiconductor light-emitting element 10. Semiconductor light-emitting element 10 includes light emission layer 15, electron barrier layer 18, and p-type clad layer 19. In the present embodiment, semiconductor light-emitting element 10 further includes substrate 11, n-type clad layer 13, n-side guide layer 14, p-side guide layer 16, intermediate layer 17, contact layer 20, current block layer 21, p-side electrode 22, pad electrode 23, n-side electrode 24, and adhesion layer 25.

Substrate 11 is a base of semiconductor light-emitting element 10. Substrate 11 is, for example, a group III nitride semiconductor substrate. Each semiconductor layer of semiconductor light-emitting element 10 is disposed above the main surface of substrate 11. In the present embodiment, substrate 11 is a hexagonal n-type GaN substrate having a thickness of 85 μm. Substrate 11 is doped with Si at a concentration of $1 \times 10^{18}$ cm$^{-3}$ as an impurity.

N-type clad layer 13 is an example of a clad layer of a first conductivity type disposed above substrate 11. In the present embodiment, the first conductivity type is n-type, and n-type clad layer 13 is an $Al_{0.035}Ga_{0.965}N$ layer having a thickness of 1500 nm. N-type clad layer 13 is doped with Si at a concentration of $1 \times 10^{18}$ cm$^{-3}$ as an impurity.

N-side guide layer 14 is a layer disposed above n-type clad layer 13 and below light emission layer 15, has a refractive index higher than a refractive index of n-type clad layer 13, and has a function of confining light to the vicinity of light emission layer 15. In the present embodiment, n-side guide layer 14 includes a GaN layer having a thickness of 100 nm and doped with Si at a concentration of $1 \times 10^{18}$ cm$^{-3}$ as an impurity and an undoped $In_{0.03}Ga_{0.97}N$ layer having a thickness of 175 nm, which are sequentially layered from the n-type clad layer 13 side.

In semiconductor light-emitting element 10, light emission layer 15 is a layer that generates light, and is an active layer including a group III nitride semiconductor. In the present embodiment, light emission layer 15 is an undoped quantum well active layer. Light emission layer 15 is an active layer having a quantum well structure in which quantum well layers including InGaN and quantum barrier layers including InGaN are alternately layered. More specifically, light emission layer 15 includes a barrier layer including an $In_{0.04}Ga_{0.96}N$ layer having a thickness of 7 nm, a well layer including an $In_{0.18}Ga_{0.82}N$ layer having a thickness of 2.8 nm, a barrier layer including an $In_{0.04}Ga_{0.96}N$ layer having a thickness of 7 nm, a well layer including an $In_{0.18}Ga_{0.82}N$ layer having a thickness of 2.8 nm, and a barrier layer including an $In_{0.04}Ga_{0.96}N$ layer having a thickness of 5 nm, which are sequentially layered from the n-side guide layer 14 side.

P-side guide layer 16 is a layer disposed above light emission layer 15 and below p-type clad layer 19, has a refractive index higher than a refractive index of p-type clad layer 19, and has a function of confining light to the vicinity of light emission layer 15. In the present embodiment, p-side guide layer 16 has a thickness of 98 nm and includes an undoped $In_{0.03}Ga_{0.97}N$ layer.

Intermediate layer 17 is a layer disposed between p-side guide layer 16 and electron barrier layer 18. In the present embodiment, intermediate layer 17 includes an undoped InGaN layer having a thickness of 21 nm and a GaN layer having a thickness of 3 nm and doped with Mg at a concentration of $2 \times 10^{19}$ cm$^{-3}$ as an impurity, which are sequentially layered from the p-side guide layer 16 side. Note that the In composition ratio of the undoped InGaN layer included in intermediate layer 17 gradually decreases from 3% to 0% from the end portion on the p-side guide layer 16 side toward the end portion on the electron barrier layer 18 side.

Electron barrier layer 18 is a layer disposed above light emission layer 15 and includes a group III nitride semiconductor containing Al. Electron barrier layer 18 is a barrier layer for suppressing leakage of electrons to p-type clad layer 19. In the present embodiment, electron barrier layer 18 includes: an $Al_xGa_{1-x}N$ layer (an inclined composition region) having a thickness of 5 nm, doped with Mg at a concentration of $2 \times 10^{19}$ cm$^{-3}$ as an impurity, and having an Al composition x that changes with an inclination from 2% to 36%; and an $Al_{0.36}Ga_{0.64}N$ layer (a constant composition region) having a thickness of 2 nm and doped with Mg at a concentration of $2 \times 10^{19}$ cm$^{-3}$ as an impurity, which are sequentially layered from the intermediate layer 17 side. Electron barrier layer 18 may have an Mg concentration of $1 \times 10^{17}$ cm$^{-3}$ or more and $1 \times 10^{20}$ cm$^{-3}$ or less, for example. As described above, by doping electron barrier layer 18 with Mg, the resistance of electron barrier layer 18 can be reduced.

P-type clad layer 19 is an example of a clad layer of a second conductivity type disposed above and in contact with electron barrier layer 18. P-type clad layer 19 is a layer having a refractive index lower than a refractive index of light emission layer 15, and having a bandgap energy higher than a bandgap energy of light emission layer 15. Since the refractive index of p-type clad layer 19 is lower than the refractive index of light emission layer 15, light can be confined to light emission layer 15. Further, since the bandgap energy of p-type clad layer 19 is higher than the bandgap energy of light emission layer 15, light absorption in p-type clad layer 19 can be suppressed. The second conductivity type is a conductivity type different from the first conductivity type. In the present embodiment, the second conductivity type is p-type, and p-type clad layer 19 is an $Al_{0.035}Ga_{0.965}N$ layer having a thickness of 660 nm and doped with Mg at a concentration of about $2 \times 10^{18}$ cm$^{-3}$ or more and $1 \times 10^{19}$ cm$^{-3}$ or less as an impurity. The detailed configuration of p-type clad layer 19 will be described later.

Contact layer 20 is a layer that makes ohmic contact with p-side electrode 22. In the present embodiment, contact layer 20 includes: a GaN layer having a thickness of 50 nm and doped with Mg at a concentration of $2\times10^{19}$ cm$^{-3}$ as an impurity; and a GaN layer having a thickness of 10 nm and doped with Mg at a concentration of $2\times10^{20}$ cm$^{-3}$ as an impurity, which are sequentially layered from the p-type clad layer 19 side.

As illustrated in FIG. 1, p-type clad layer 19 includes a protrusion protruding in the direction from n-side electrode 24 toward p-side electrode 22. Further, contact layer 20 is provided on the protrusion of p-type clad layer 19. The protrusion of p-type clad layer 19 and contact layer 20 form ridge 19r.

Current block layer 21 is an insulating layer that interrupts current flowing through contact layer 20 and p-type clad layer 19 except ridge 19r. Current block layer 21 covers p-type clad layer 19 exposed from contact layer 20. Contact layer 20, which is the upper surface of ridge 19r, is not covered by current block layer 21 and is exposed from current block layer 21. In the present embodiment, current block layer 21 is a SiO$_2$ film having a thickness of 300 nm.

P-side electrode 22 is an electrode that makes ohmic contact with contact layer 20. P-side electrode 22 is disposed on the upper surface of contact layer 20, that is, the upper surface of ridge 19r. In the present embodiment, p-side electrode 22 includes a Pd film having a thickness of 40 nm and a Pt film having a thickness of 35 nm, which are sequentially layered from the contact layer 20 side.

Pad electrode 23 is a pad-shaped electrode disposed above p-side electrode 22. In the present embodiment, pad electrode 23 is disposed on p-side electrode 22 and current block layer 21. Pad electrode 23 is an Au film having a thickness of 2 μm.

Adhesion layer 25 is provided to enhance the adhesion of pad electrode 23 to current block layer 21. Adhesion layer 25 is provided between and in contact with pad electrode 23 and current block layer 21. Adhesion layer 25 is provided on both sides of the ridge, for example. Adhesion layer 25 is formed using a metal material. Specifically, adhesion layer 25 has, for example, a layered structure of a Ti film having a thickness of 10 nm and a Pt film having a thickness of 50 nm. The Ti film is located on the lower layer side and is in contact with current block layer 21.

N-side electrode 24 is an electrode disposed on the lower surface of substrate 11 (that is, a main surface of substrate 11 opposite the main surface thereof on which n-type clad layer 13 is disposed). In the present embodiment, n-side electrode 24 includes a Ti film having a thickness of 10 nm, a Pt film having a thickness of 35 nm, and an Au film having a thickness of 300 nm, which are sequentially layered from the substrate 11 side.

[2. Detailed Configurations of Electron Barrier Layer and P-Type Clad Layer]

Figure 3:
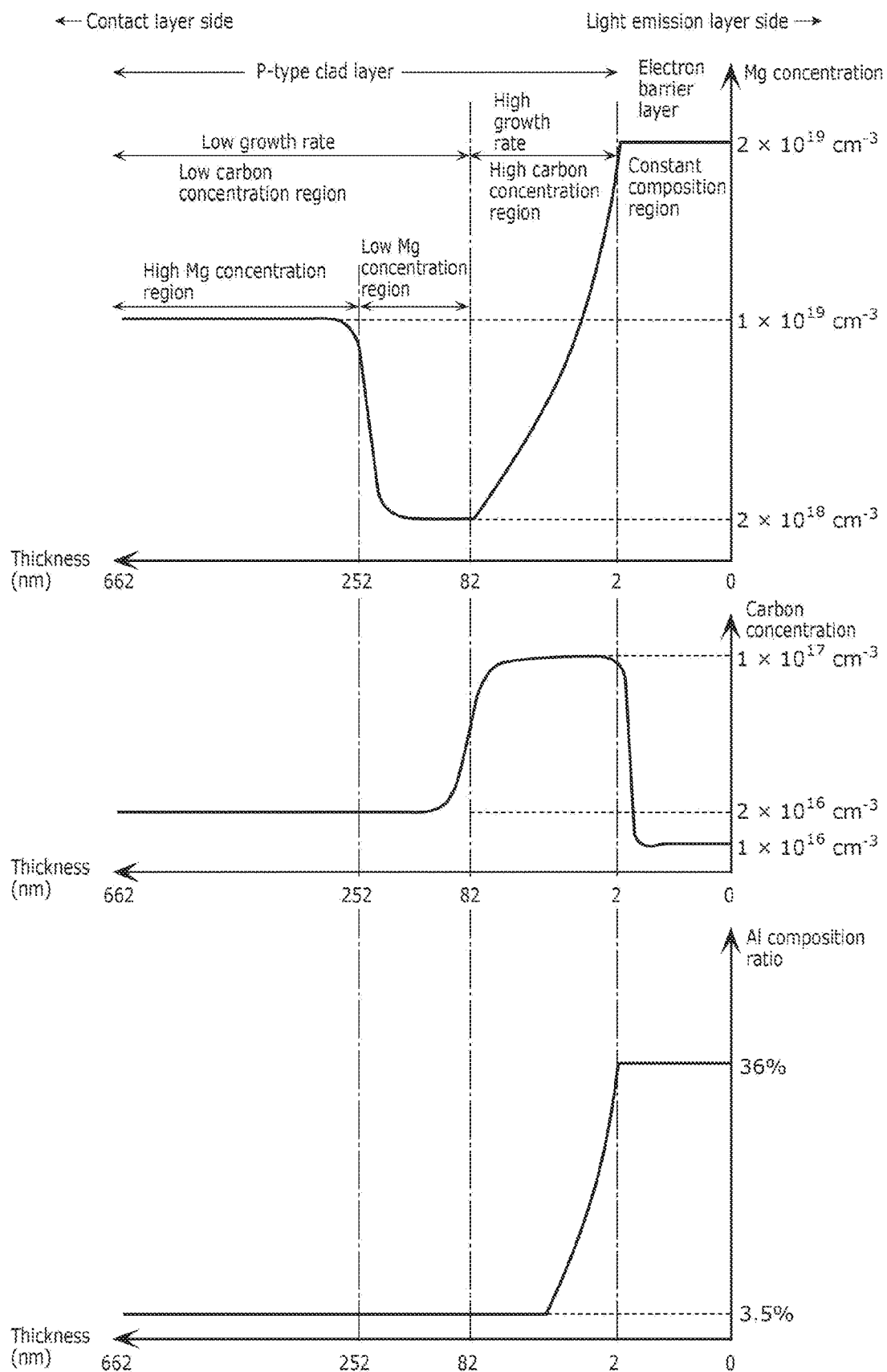
FIG. 3 illustrates graphs showing distributions of Mg concentration, carbon concentration, and Al composition ratio with respect to positions in a part of an electron barrier layer (a constant composition region) and a p-type clad layer in the layering direction according to the embodiment.

Next, the detailed configurations of electron barrier layer 18 and p-type clad layer 19 according to the present embodiment will be described with reference to FIG. 3. FIG. 3 illustrates graphs showing distributions of Mg concentration, carbon concentration, and Al composition ratio with respect to positions in a part of electron barrier layer 18 (the constant composition region) and p-type clad layer 19 in the layering direction according to the present embodiment. In FIG. 3, the distributions of the Mg concentration, the carbon concentration, and the Al composition ratio are illustrated in the stated order from the upper row. Here, the layering direction means the thickness direction in which the semiconductor layers are layered, that is, the direction perpendicular to the main surface of substrate 11.

The horizontal axis of each graph in FIG. 3 represents the thickness, and the position 5 nm from the end of electron barrier layer 18 on the light emission layer 15 side, that is, the boundary between the inclined composition region and the constant composition region is used as the reference (0 nm). In other words, the horizontal axis of each graph in FIG. 3 represents the distance in the thickness direction from the boundary between the inclined composition region and the constant composition region. The thickness increases with a decrease in distance to contact layer 20. The vertical axes of the graphs in the upper, middle, and lower rows represent the Mg concentration, the carbon concentration, and the Al composition ratio, respectively.

As illustrated in the graph in the upper row of FIG. 3, the constant composition region of electron barrier layer 18 and p-type clad layer 19 contain Mg as a dopant.

In the present embodiment, the Mg concentration is about $2\times10^{19}$ cm$^{-3}$ and the carbon concentration is about $1\times10^{16}$ cm$^{-3}$ in the constant composition region of electron barrier layer 18. The graph in the upper row of FIG. 3 does not show the inclined composition region of electron barrier layer 18, but in the inclined composition region, too, the Mg concentration is about $2\times10^{19}$ cm$^{-3}$ and the carbon concentration is about $1\times10^{16}$ cm$^{-3}$. In the constant composition region and the inclined composition region of electron barrier layer 18, the Al composition is different but the Mg concentration and the carbon concentration are the same. As described above, electron barrier layer 18 includes a region in which the concentration ratio of carbon to Mg is $1\times10^{-3}$ or less. As described above, by forming a region having a high Mg concentration in electron barrier layer 18, the resistance of electron barrier layer 18 can be reduced.

P-type clad layer 19 includes a high carbon concentration region containing carbon (a region from 2 nm to 82 nm in thickness) and a low carbon concentration region (a region from 82 nm upward in thickness) having a carbon concentration lower than the carbon concentration of the high carbon concentration region, in the stated order from the electron barrier layer 18 side. In the present embodiment, the carbon concentration in the high carbon concentration region is about $1\times10^{17}$ cm$^{-3}$, and the carbon concentration in the low carbon concentration region is about $2\times10^{16}$ cm$^{-3}$. Note that the carbon concentration in electron barrier layer 18 is about $1\times10^{16}$ cm$^{-3}$. The carbon concentration of p-type clad layer 19 can be implemented by, for example, changing the growth rate (that is, the crystal growth rate) of p-type clad layer 19.

Figure 4:
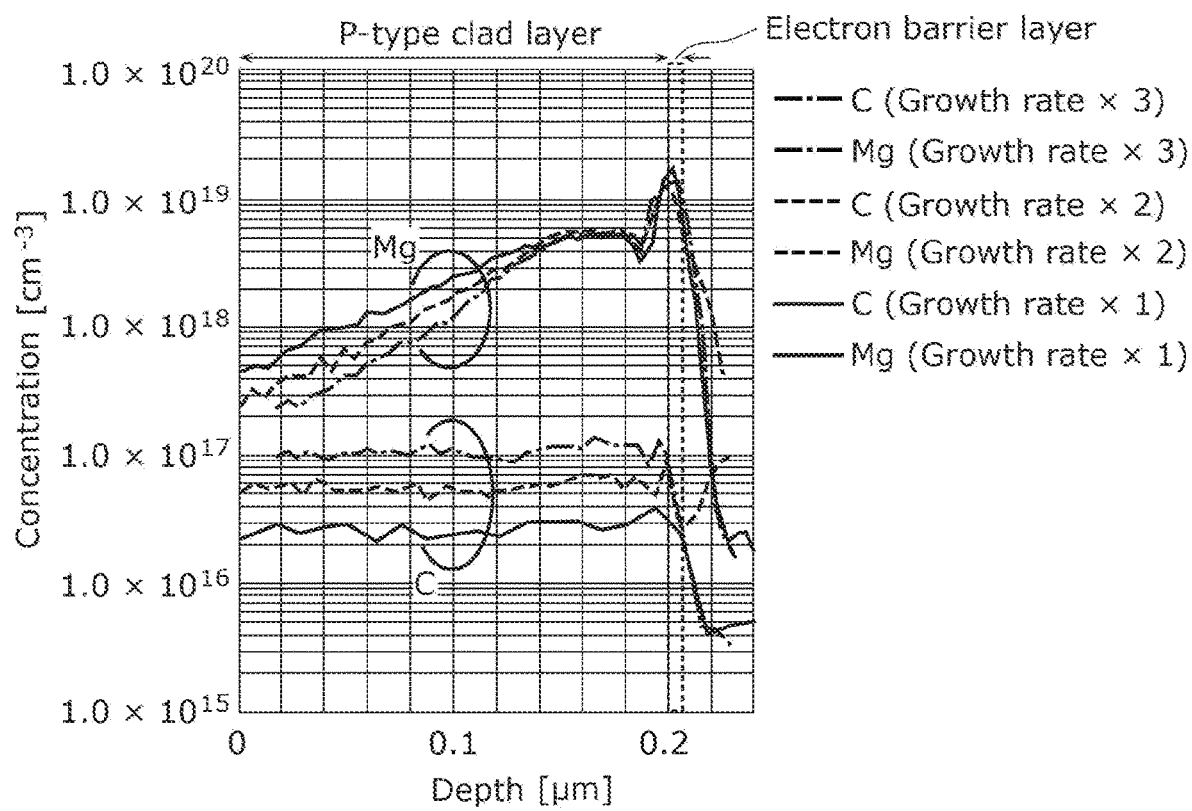
FIG. 4 is a graph showing distribution of Mg and carbon concentrations with respect to positions in the electron barrier layer and the p-type clad layer in the layering direction according to the embodiment.

Here, the relationship between the growth rate of p-type clad layer 19 and the Mg and carbon concentrations will be described with reference to FIG. 4. FIG. 4 is a graph showing distribution of the Mg and carbon concentrations with respect to positions in electron barrier layer 18 and p-type clad layer 19 in the layering direction according to the present embodiment. The horizontal axis of the graph illustrated in FIG. 4 represents the depth, and the depth at a position in p-type clad layer 19 where the distance from electron barrier layer 18 is about 0.2 μm is set to 0 nm, and the depth increases with an increase in distance toward electron barrier layer 18. In FIG. 4, the relationship in the case where the growth rate of p-type clad layer 19 is 11.4 nm/min (×1), the relationship in the case where the growth rate is twice 11.4 nm/min (×2), and the relationship in the case where the growth rate is triple 11.4 nm/min (×3) are shown by solid lines, broken lines, and chained lines, respectively. The growth rate of electron barrier layer 18 is 3.6 nm/min in each case. The relationships illustrated in FIG. 4 are based on analysis results obtained by secondary ion mass spectrometry (SIMS) performed on electron barrier layer 18 and p-type clad layer 19 that were actually fabricated. Note that in the example illustrated in FIG. 4, a raw material gas containing Mg is not supplied at the time of forming p-type clad layer 19.

As illustrated in FIG. 4, the Mg concentration decreases as the growth rate of p-type clad layer 19 increases.

On the other hand, the carbon concentration rises as the growth rate of p-type clad layer 19 increases. The carbon contained in p-type clad layer 19 is considered to derive from a raw material gas used for forming p-type clad layer 19. The Mg concentration is considered to decrease due to the Mg uptake amount being suppressed by a rise in the carbon concentration caused by an increase in the growth rate as described above. Further, as the carbon concentration rises, the crystal quality of p-type clad layer 19 deteriorates. Therefore, in the present embodiment, the growth rate is increased when forming, of p-type clad layer 19, a region in which the influence of residual Mg is significant, that is, a region relatively close to electron barrier layer 18, whereas the growth rate is decreased when forming a region relatively far from electron barrier layer 18. As a result, as illustrated in FIG. 3, p-type clad layer 19 includes a high carbon concentration region containing carbon and a low carbon concentration region having a carbon concentration lower than the carbon concentration of the high carbon concentration region, in the stated order from the electron barrier layer 18 side.

As described above, since the region in which the Mg concentration is suppressed is disposed closer to electron barrier layer 18 (that is, closer to light emission layer 15) than the low carbon concentration region, it is possible to suppress the Mg concentration in the region having a higher light intensity. This makes it possible to suppress the light absorption loss in the p-type clad layer caused by Mg. That is to say, it is possible to suppress an increase in light absorption loss in p-type clad layer 19 caused by the provision of electron barrier layer 18 in semiconductor light-emitting element 10.

Further, since p-type clad layer 19 includes the low carbon concentration region having a carbon concentration lower than the carbon concentration of the high carbon concentration region, it is possible to suppress deterioration of the crystal quality of p-type clad layer 19 as compared to the case where entire p-type clad layer 19 is the high carbon concentration region.

Further, as described above, since the uptake of Mg into p-type clad layer 19 can be suppressed in the high carbon concentration region, the high carbon concentration region includes a decrease region in which the Mg concentration decreases with an increase in distance from electron barrier layer 18. In other words, in the high carbon concentration region, the Mg concentration can be sharply decreased with respect to the depth. In the present embodiment, the region from 2 nm to 82 nm in thickness as illustrated in FIG. 3 corresponds to the decrease region.

As described above, by decreasing the Mg concentration in p-type clad layer 19, it is possible to suppress an increase in light absorption loss in p-type clad layer 19 caused by the provision of electron barrier layer 18.

The decrease region includes a region which is separated from the interface between p-type clad layer 19 and electron barrier layer 18 by 50 nm or more and in which the rate of change in Mg concentration with respect to a position in the layering direction is $0.5 \times 10^{17}$ cm$^{-3}$/nm or more. As described above, since p-type clad layer 19 includes a region in which the Mg concentration sharply decreases, it is possible to suppress an increase in light absorption loss in p-type clad layer 19 caused by the provision of electron barrier layer 18.

Further, p-type clad layer 19 includes a low Mg concentration region containing Mg and a high Mg concentration region disposed above the low Mg concentration region and having an Mg concentration higher than the Mg concentration of the low Mg concentration region. As described above, since p-type clad layer 19 includes the low Mg concentration region at a position closer to electron barrier layer 18 than the high Mg concentration region, it is possible to suppress an increase in light absorption loss in p-type clad layer 19 caused by the provision of electron barrier layer 18. Further, since p-type clad layer 19 includes the high Mg concentration region, the resistance of the clad layer can be reduced. Note that in the graph illustrated in the upper row of FIG. 3, only a part of the low carbon concentration region is shown as the low Mg concentration region, but the low Mg concentration region may be included in the high carbon concentration region.

Figure 5:
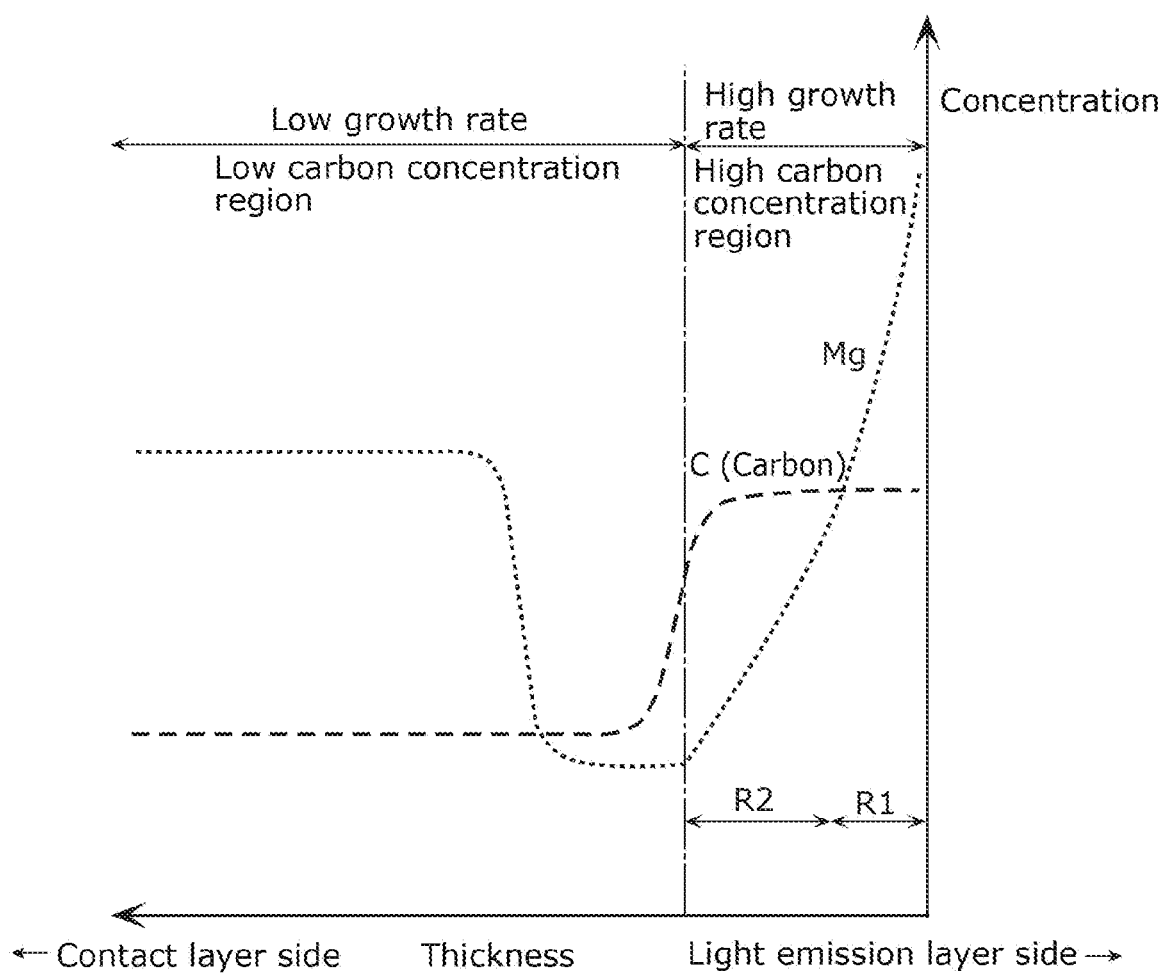
FIG. 5 is a graph showing distribution of Mg and carbon concentrations with respect to positions in the p-type clad layer in the layering direction according to the embodiment.

Next, the distribution of the concentration ratio of carbon to Mg in p-type clad layer 19 according to the present embodiment will be described with reference to FIG. 3 and FIG. 5. FIG. 5 is a graph showing distribution of the Mg and carbon concentrations with respect to positions in p-type clad layer 19 in the layering direction according to the present embodiment. The horizontal axis of the graph illustrated in FIG. 5 represents the thickness as in FIG. 3, and the vertical axis represents the concentrations of Mg and carbon. Note that in the graph, the vertical axis represents the Mg concentration and the carbon concentration that are individually standardized, in order to show the curves of the Mg concentration and the carbon concentration at about the same position.

As illustrated in FIG. 5, in the high carbon concentration region of p-type clad layer 19, the carbon concentration is generally uniform. In contrast, the Mg concentration decreases in the high carbon concentration region as described above. That is to say, in the region close to electron barrier layer 18, the Mg concentration becomes high due to the influence of the residual Mg resulting from the formation of electron barrier layer 18, whereas in the region located away from electron barrier layer 18, the Mg concentration becomes low because the influence of the residual Mg is reduced. Therefore, p-type clad layer 19 includes low concentration ratio region R1 which is disposed in a region close to electron barrier layer 18 and in which the concentration ratio of carbon to Mg is low and high concentration ratio region R2 which is disposed above low concentration ratio region R1 (that is, on the contact layer 20 side) and in which the concentration ratio of carbon to Mg is higher than that of low concentration ratio region R1. In the present embodiment, p-type clad layer 19 includes, in low concentration ratio region R1, a region having a carbon concentration of about $1 \times 10^{17}$ cm$^{-3}$ and an Mg concentration of $1 \times 10^{19}$ cm$^{-3}$ or more as illustrated in FIG. 3, that is, a region in which the concentration ratio of carbon to Mg is 1% or less.

As described above, since p-type clad layer 19 includes low concentration ratio region R1 having a low Mg concentration, at a position closer to the electron barrier layer than high concentration ratio region R2, it is possible to suppress an increase in light absorption loss in p-type clad layer 19 caused by the provision of electron barrier layer 18.

[3. Fabrication Method]

Next, a method of fabricating semiconductor light-emitting element 10 according to the present embodiment will be described. First, an outline of a method of fabricating entire semiconductor light-emitting element 10 according to the present embodiment will be described.

The semiconductor layers of semiconductor light-emitting element 10 can be sequentially formed on the main surface of substrate 11 by metal organic chemical vapor deposition (MOCVD), for example. Note that ridge 19r can be formed by photolithography and etching.

Current block layer 21 can be formed by plasma chemical vapor deposition (CVD), for example.

Of current block layer 21, only the portion formed on contact layer 20 of ridge 19r (that is, the portion in contact with contact layer 20) is removed by photolithography and etching. Subsequently, p-side electrode 22 is formed only above ridge 19r, using a vacuum vapor deposition method and a lift-off method.

Adhesion layer 25 having a predetermined shape is formed on current block layer 21. Specifically, similarly to p-side electrode 22, adhesion layer 25 is formed by formation of a metal film and a lift-off method. The metal film includes a layered film of a Ti film and a Pt film, and is formed by a vapor deposition method or a sputtering method. Adhesion layer 25 is formed only on current block layer 21, and is not in contact with p-type contact layer 20 and p-side electrode 22.

After p-side electrode 22 and adhesion layer 25 are formed, pad electrode 23 is formed using a vacuum vapor deposition method and a lift-off method. Further, n-side electrode 24 is formed on the lower surface of substrate 11 using a vacuum vapor deposition method and a lift-off method.

Figure 6:
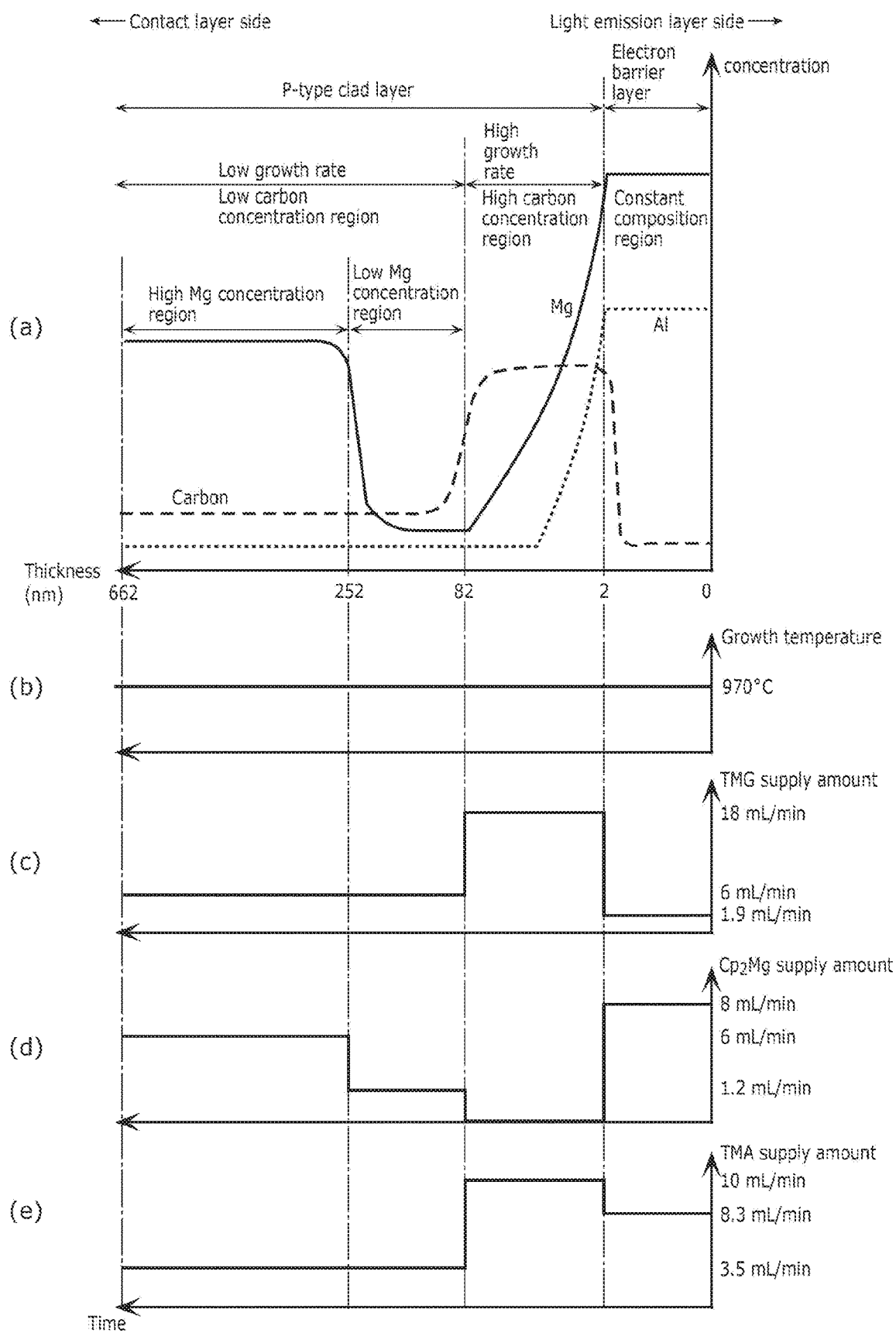
FIG. 6 illustrates graphs showing a method of fabricating the electron barrier layer and the p-type clad layer according to the embodiment.

Subsequently, the following describes, with reference to FIG. 6, a method of forming electron barrier layer 18 and p-type clad layer 19, which are characteristic constituent elements of semiconductor light-emitting element 10 according to the present embodiment. FIG. 6 illustrates graphs showing a method of fabricating electron barrier layer 18 and p-type clad layer 19 according to the present embodiment.

Graph (a) in FIG. 6 shows the distributions of the Mg concentration, the carbon concentration, and the Al composition ratio with respect to positions in (the thicknesses of) the constant composition region of electron barrier layer 18 and p-type clad layer 19 in the layering direction. The horizontal axis of graph (a) represents thickness corresponding to position in the layering direction as with the horizontal axis illustrated in FIG. 3. Further, in graph (a), the Mg concentration, the carbon concentration, and the Al composition ratio are represented by curves of a solid line, a broken line, and a dotted line, respectively. The vertical axis represents the Mg concentration, the carbon concentration, and the Al concentration that are individually standardized, in order to show the curves of the Mg concentration, the carbon concentration, and the Al concentration (that is, the Al composition ratio) at about the same position.

Graph (b) In FIG. 6 shows the relationship between the time spent for crystal growth of the constant composition region of electron barrier layer 18 and p-type clad layer 19 (the horizontal axis) and the growth temperature (the vertical axis). Note that the time represented by the horizontal axis is associated with the thickness in graph (a).

Graphs (c), (d), and (e) in FIG. 6 show the relationship between the time spent for crystal growth of the constant composition region of electron barrier layer 18 and p-type clad layer 19 (the horizontal axis) and the supply amount of each raw material gas forming the constant composition region of electron barrier layer 18 and p-type clad layer 19 (the vertical axis). Graphs (c), (d), and (e) in FIG. 6 show the supply amounts of trimethyl gallium (TMG), biscyclopentadienyl magnesium ($Cp_2Mg$), and trimethyl aluminum (TMA), respectively.

As shown in graph (b) in FIG. 6, the growth temperature of the constant composition region of electron barrier layer 18 and p-type clad layer 19 is constant at 970° C.

First, a method of forming the constant composition region of electron barrier layer 18 will be described. In the present embodiment, electron barrier layer 18 that includes a group III nitride semiconductor containing Al is formed on intermediate layer 17. Following the inclined composition region of electron barrier layer 18, the constant composition region is formed. As illustrated in FIG. 6, the TMG supply amount, the $Cp_2Mg$ supply amount, and the TMA supply amount at the time of forming the constant composition region of electron barrier layer 18 are 1.9 mL/min, 8 mL/min, and 8.3 mL/min, respectively. As described above, by supplying $Cp_2Mg$ at the time of forming the constant composition region of electron barrier layer 18, Mg is supplied as a dopant. Note that the amount of each raw material gas supplied at the time of forming the constant composition region of electron barrier layer 18 is constant. The crystal growth of the constant composition region of electron barrier layer 18 is continued until the thickness reaches 2 nm (that is, continued for a length of the crystal growth time corresponding to the thickness of 2 nm).

After the end of the formation of the constant composition region of electron barrier layer 18, the crystal growth of p-type clad layer 19 is started. First, of p-type clad layer 19, a high carbon concentration region which is to be in contact with the constant composition region of electron barrier layer 18 is formed. The TMG supply amount, $Cp_2Mg$ supply amount, and TMA supply amount at the time of forming the high carbon concentration region are 18 mL/min, 0 mL/min, and 10 mL/min, respectively. As can be understood from above, it is not necessary to supply a raw material gas containing Mg for the crystal growth of the high carbon concentration region. As described above, of p-type clad layer 19, in the region which is close to the constant composition region of electron barrier layer 18, the residual Mg causes p-type clad layer 19 to be doped with Mg even without the supply of a raw material gas containing Mg. The crystal growth of the high carbon concentration region is continued until the thickness reaches 80 nm.

Subsequently, a low carbon concentration region is formed on the high carbon concentration region of p-type clad layer 19. First, of the low carbon concentration region, a low Mg concentration region is formed. The TMG supply amount, $Cp_2Mg$ supply amount, and TMA supply amount at the time of forming the low Mg concentration region are 6 mL/min, 1.2 mL/min, and 3.5 mL/min, respectively. The crystal growth of the low Mg concentration region is continued until the thickness reaches 170 nm.

Subsequently, of the low carbon concentration region, a high Mg concentration region is formed. The TMG supply amount, $Cp_2Mg$ supply amount, and TMA supply amount at the time of forming the high Mg concentration region are 6 mL/min, 6 mL/min, and 3.5 mL/min, respectively. The crystal growth of the high Mg concentration region is continued until the thickness reaches 410 nm.

Electron barrier layer 18 and p-type clad layer 19 according to the present embodiment can be formed as described above. Further, as described above, in the method of fabricating semiconductor light-emitting element 10 according to the present embodiment, the forming of the constant composition region of electron barrier layer 18 includes supplying Mg as a dopant, and the forming of p-type clad layer 19 includes changing the growth rate. By changing the growth rate in the forming of p-type clad layer 19 as described above, p-type clad layer 19 includes a region that is formed at a high growth rate. In the region formed at a high growth rate, it is possible to suppress the uptake of Mg used at the time of forming the constant composition region of electron barrier layer 18, and therefore, p-type clad layer 19 can include a region in which the Mg concentration is suppressed. This makes it possible to suppress an increase in light absorption loss in p-type clad layer 19 caused by the provision of electron barrier layer 18.

Further, in the forming of p-type clad layer 19, the growth rate is changed by changing the Ga supply amount. Specifically, the TMG supply amount corresponding to the Ga supply amount is 18 mL/min in the high carbon concentration region, and 6 mL/min in the low carbon concentration region.

As described above, by changing the Ga supply amount, the amount of Mg uptake into p-type clad layer 19 can be changed. Since the Mg concentration can be suppressed in the region in which the Ga supply amount is high, it is possible to suppress an increase in light absorption loss in p-type clad layer 19 caused by the provision of electron barrier layer 18.

Further, the Ga supply amount in the forming of p-type clad layer 19 is greater immediately after the start of the forming of p-type clad layer 19 than immediately before the end of the forming of p-type clad layer 19. In other words, the Ga supply amount is greater in the high carbon concentration region than in the low carbon concentration region.

As a result, the Mg concentration in, of p-type clad layer 19, the region adjacent to electron barrier layer 18 can be suppressed. Therefore, since the Mg concentration can be suppressed in, of p-type clad layer 19, the region in which the light intensity is the highest, it is possible to further suppress an increase in light absorption loss in p-type clad layer 19 caused by the provision of electron barrier layer 18.

Note that in the present embodiment, the $Cp_2Mg$ supply amount (that is, the Mg supply amount) is increased stepwise in the low carbon concentration region, but it may be increased continuously. As described above, by increasing the Mg supply amount in the low carbon concentration region, it is possible to increase the Mg concentration of p-type clad layer 19 as a whole while suppressing the Mg concentration in the region close to light emission layer 15. Therefore, the resistance of p-type clad layer 19 can be reduced while suppressing an increase in light absorption loss in p-type clad layer 19.

Variations Etc.

Although the semiconductor laser element and so on according to the present disclosure have been described above based on the above embodiment, the present disclosure is not limited to the above embodiment.

For example, in the above embodiment, p-type clad layer 19 includes the low Mg concentration region and the high Mg concentration region disposed on the low Mg concentration region, but a region having a high Mg concentration may be formed closer to electron barrier layer 18 than the low Mg concentration region.

Further, a superlattice structure may be applied to p-type clad layer 19 according to the above embodiment. Such a superlattice structure can be formed by intermittently supplying TMA at the time of forming the p-type clad layer, for example.

Further, although the above embodiment has illustrated an example in which the semiconductor light-emitting element is a semiconductor laser element, the semiconductor light-emitting element is not limited to a semiconductor laser element. For example, the semiconductor light-emitting element may be a superluminescent diode.

In addition, a buffer layer may be formed between substrate 11 and n-type clad layer 13. The buffer layer is a layer for suppressing distortion caused by lattice mismatch between substrate 11 and n-type clad layer 13. For example, the buffer layer is an $Al_{0.01}Ga_{0.99}N$ layer having a thickness of 100 nm.

Furthermore, the present disclosure encompasses: embodiments achieved by making various modifications conceivable to a person skilled in the art to the above embodiment; and embodiments implemented by arbitrarily combining constituent elements and functions in the above embodiment without departing from the essence of the present disclosure.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The semiconductor light-emitting element according to the present disclosure can be applied to, for example, projectors, lighting, and laser processing machines as a light source with high output and high efficiency.

The invention claimed is:

1. A semiconductor light-emitting element comprising:
    a light emission layer including a group III nitride semiconductor;
    an electron barrier layer disposed above the light emission layer and including a group III nitride semiconductor containing Al; and
    a clad layer disposed above and in contact with the electron barrier layer and including a group III nitride semiconductor, wherein:
    the electron barrier layer and the clad layer contain Mg as a dopant,
    the clad layer includes a high carbon concentration region containing carbon and a low carbon concentration region having a carbon concentration lower than a carbon concentration of the high carbon concentration region, in a stated order from an electron barrier layer side, and
    each of the high carbon concentration region and the low carbon concentration region has an Mg concentration higher than the carbon concentration.

2. The semiconductor light-emitting element according to claim 1, wherein
    the clad layer has a bandgap energy higher than a bandgap energy of the light emission layer.

3. The semiconductor light-emitting element according to claim 1, wherein
    the clad layer is an AlGaN layer.

4. The semiconductor light-emitting element according to claim 1, further comprising:
    a contact layer disposed above the clad layer.

5. The semiconductor light-emitting element according to claim 1, wherein the clad layer includes a low concentration ratio region in which a concentration ratio of carbon to Mg is low and a high concentration ratio region which is disposed above the low concentration ratio region and in which the concentration ratio of carbon to Mg is higher than the concentration ratio of carbon to Mg in the low concentration ratio region.

6. The semiconductor light-emitting element according to claim 1, wherein
the clad layer includes a region in which a concentration ratio of carbon to Mg is 1% or less.

7. The semiconductor light-emitting element according to claim 1, wherein
the electron barrier layer has an Mg concentration of $1\times10^{17}$ cm$^{-3}$ or more and $1\times10^{20}$ cm$^{-3}$ or less.

8. The semiconductor light-emitting element according to claim 1, wherein
the clad layer is disposed above a main surface of a group III nitride semiconductor substrate.

9. The semiconductor light-emitting element according to claim 1, wherein
the electron barrier layer includes a region in which a concentration ratio of carbon to Mg is $1\times10^{-3}$ or less.

10. A semiconductor light-emitting element comprising:
a light emission layer including a group III nitride semiconductor;
an electron barrier layer disposed above the light emission layer and including a group III nitride semiconductor containing Al; and
a clad layer disposed above and in contact with the electron barrier layer, wherein:
the electron barrier layer and the clad layer contain Mg as a dopant,
the clad layer includes a high carbon concentration region containing carbon and a low carbon concentration region having a carbon concentration lower than a carbon concentration of the high carbon concentration region, in a stated order from an electron barrier layer side, and
the high carbon concentration region includes a decrease region in which an Mg concentration decreases with an increase in distance from the electron barrier layer.

11. The semiconductor light-emitting element according to claim 10, wherein
the decrease region includes a region which is separated from an interface between the clad layer and the electron barrier layer by 50 nm or more and in which a rate of change in Mg concentration with respect to a position in a layering direction is $0.5\times10^{17}$ cm$^{-3}$/nm or more.

12. The semiconductor light-emitting element according to claim 10, wherein
the clad layer includes a group III nitride semiconductor.

13. The semiconductor light-emitting element according to claim 10, wherein
each of the high carbon concentration region and the low carbon concentration region has an Mg concentration higher than the carbon concentration.

14. The semiconductor light-emitting element according to claim 10, wherein
the clad layer includes a low concentration ratio region in which a concentration ratio of carbon to Mg is low and a high concentration ratio region which is disposed above the low concentration ratio region and in which the concentration ratio of carbon to Mg is higher than the concentration ratio of carbon to Mg in the low concentration ratio region.

15. The semiconductor light-emitting element according to claim 10, wherein
the clad layer includes a region in which a concentration ratio of carbon to Mg is 1% or less.

16. The semiconductor light-emitting element according to claim 10, wherein
the clad layer includes a low Mg concentration region containing Mg and a high Mg concentration region disposed above the low Mg concentration region and having an Mg concentration higher than an Mg concentration of the low Mg concentration region.

17. The semiconductor light-emitting element according to claim 10, wherein
the electron barrier layer has an Mg concentration of $1\times10^{17}$ cm$^{-3}$ or more and $1\times10^{20}$ cm$^{-3}$ or less.

18. The semiconductor light-emitting element according to claim 10, wherein
the electron barrier layer includes a region in which a concentration ratio of carbon to Mg is $1\times10^{-3}$ or less.

19. A semiconductor light-emitting element comprising:
a light emission layer including a group III nitride semiconductor;
an electron barrier layer disposed above the light emission layer and including a group III nitride semiconductor containing Al; and
a clad layer disposed above and in contact with the electron barrier layer, wherein:
the electron barrier layer and the clad layer contain Mg as a dopant,
the clad layer includes a high carbon concentration region containing carbon and a low carbon concentration region having a carbon concentration lower than a carbon concentration of the high carbon concentration region, in a stated order from an electron barrier layer side, and
the clad layer includes a low Mg concentration region containing Mg and a high Mg concentration region disposed above the low Mg concentration region and having an Mg concentration higher than an Mg concentration of the low Mg concentration region.

20. The semiconductor light-emitting element according to claim 19, wherein
the clad layer includes a group III nitride semiconductor.

21. The semiconductor light-emitting element according to claim 19, wherein
each of the high carbon concentration region and the low carbon concentration region has an Mg concentration higher than the carbon concentration.

22. The semiconductor light-emitting element according to claim 19, further comprising:
a contact layer disposed above the clad layer.

23. The semiconductor light-emitting element according to claim 19, wherein
the clad layer includes a low concentration ratio region in which a concentration ratio of carbon to Mg is low and a high concentration ratio region which is disposed above the low concentration ratio region and in which the concentration ratio of carbon to Mg is higher than the concentration ratio of carbon to Mg in the low concentration ratio region.

24. The semiconductor light-emitting element according to claim 19, wherein
the clad layer includes a region in which a concentration ratio of carbon to Mg is 1% or less.

25. The semiconductor light-emitting element according to claim 19, wherein the electron barrier layer has an Mg concentration of $1\times10^{17}$ cm$^{-3}$ or more and $1\times10^{20}$ cm$^{-3}$ or less.

26. The semiconductor light-emitting element according to claim 19, wherein
the electron barrier layer includes a region in which a concentration ratio of carbon to Mg is $1\times10^{-3}$ or less.

* * * * *